United States Patent
Wang et al.

(10) Patent No.: US 11,619,753 B2
(45) Date of Patent: Apr. 4, 2023

(54) PROCESSING CIRCUIT AND SIGNAL PROCESSING METHOD OF SAMPLING CIRCUIT

(71) Applicants: InnoCare Optoelectronics Corporation, Tainan (TW); National Yang Ming Chiao Tung University, Hsinchu (TW)

(72) Inventors: Zhi-Hong Wang, Tainan (TW); Hsin-Hung Lin, Tainan (TW); Chih-Hao Wu, Tainan (TW); Yu-Lun Hsieh, Hsinchu (TW); Ya-Hsiang Tai, Hsinchu (TW); Cheng Che Tu, Hsinchu (TW)

(73) Assignees: InnoCare Optoelectronics Corporation, Tainan (TW); National Yang Ming Chiao Tung University, Hsinchu (TW)

( * ) Notice: Subject to any disclaimer, the term of this patent is extended or adjusted under 35 U.S.C. 154(b) by 39 days.

(21) Appl. No.: 17/359,659

(22) Filed: Jun. 28, 2021

(65) Prior Publication Data

US 2022/0026591 A1    Jan. 27, 2022

(30) Foreign Application Priority Data

Jul. 22, 2020    (CN) .......................... 202010709782.1

(51) Int. Cl.
*G01T 1/24* (2006.01)
*H03F 3/19* (2006.01)

(52) U.S. Cl.
CPC .............. *G01T 1/247* (2013.01); *H03F 3/19* (2013.01)

(58) Field of Classification Search
CPC .............. G01T 1/247; G01T 1/17; H03F 3/19
See application file for complete search history.

(56) References Cited

U.S. PATENT DOCUMENTS

| 2009/0136112 | A1  | 5/2009 | Bismuth et al. |
| 2015/0268360 | A1* | 9/2015 | Kumar ..................... A61B 6/42 250/371 |
| 2017/0035376 | A1* | 2/2017 | Surendranath .......... G01T 1/171 |
| 2021/0158738 | A1* | 5/2021 | Kim ......................... G09G 3/20 |
| 2022/0021789 | A1* | 1/2022 | Surendranath ......... A61B 6/032 |

FOREIGN PATENT DOCUMENTS

WO    9701153    1/1997

\* cited by examiner

*Primary Examiner* — Christine S. Kim
(74) *Attorney, Agent, or Firm* — JCIPRNET

(57) ABSTRACT

The disclosure provides a processing circuit adapted to read out a sensing voltage of an X-ray sensor and a signal processing method of a sampling circuit. The processing circuit includes an amplifier and the sampling circuit. An inverting input terminal of the amplifier is coupled to the X-ray sensor. The sampling circuit is coupled to an output terminal of the amplifier. The sampling circuit obtains a first voltage, a second voltage, and a sampling voltage of the X-ray sensor in different periods. The sampling voltage is between the first voltage and the second voltage. In the readout period, the sampling circuit subtracts the second voltage from the sampling voltage to obtain a third voltage, subtracts the second voltage from the first voltage to obtain a fourth voltage, and divides the third voltage by the fourth voltage to read out the sensing voltage of the X-ray sensor.

10 Claims, 7 Drawing Sheets

PROCESSING CIRCUIT AND SIGNAL PROCESSING METHOD OF SAMPLING CIRCUIT

CROSS-REFERENCE TO RELATED APPLICATION

This application claims the priority benefit of China application serial no. 202010709782.1, filed on Jul. 22, 2020. The entirety of the above-mentioned patent application is hereby incorporated by reference herein and made a part of this specification.

BACKGROUND

Technical Field

The disclosure relates to a circuit, and in particular, to a processing circuit adapted to read out an X-ray sensor, and a signal processing method of a sampling circuit.

In a common readout circuit for a light sensor, thin-film transistors (TFTs) of the light sensor may cause unstable transistor characteristics due to process errors. Accordingly, sensing signals read by the readout circuit are prone to errors, and the decoding range of the analog-to-digital converter (ADC) in the readout circuit cannot be fully used. In view of this, several embodiments are proposed below as solutions.

SUMMARY

The disclosure is directed to a processing circuit adapted to read out a light sensor and a signal processing method of a sampling circuit and capable of reading out a sensing voltage of an X-ray sensor in an effective manner.

According to an embodiment of the disclosure, a processing circuit of the disclosure is adapted to read out a sensing voltage of an X-ray sensor. The processing circuit includes an amplifier and a sampling circuit. The amplifier includes an inverting input terminal, a non-inverting input terminal, and an output terminal. The inverting input terminal of the amplifier is coupled to the X-ray sensor. The sampling circuit is coupled to the output terminal of the amplifier. The sampling circuit obtains a first voltage, a second voltage, and a sampling voltage of the X-ray sensor in different sampling periods. The sampling voltage is between the first voltage and the second voltage. The sampling circuit subtracts the second voltage from the sampling voltage to obtain a third voltage in a readout period, subtracts the second voltage from the first voltage to obtain a fourth voltage, and divides the third voltage by the fourth voltage to read out the sensing voltage of the X-ray sensor.

According to an embodiment of the disclosure, a signal processing method of a sampling circuit in the disclosure includes the following steps. A sampling voltage is obtained. A first voltage is obtained. A second voltage is obtained. The second voltage is subtracted from the sampling voltage to obtain a third voltage. The second voltage is subtracted from the first voltage to obtain a fourth voltage, and the third voltage is divided by the fourth voltage.

Based on the above, in the processing circuit and the signal process method of the sampling circuit in the disclosure, the sensing voltage of the X-ray sensor is read out by means of correlated triple sampling (CTS).

In order to make the aforementioned features and advantages of the disclosure comprehensible, embodiments accompanied with drawings are described in detail below.

DESCRIPTION OF THE EMBODIMENTS

Figure 1:
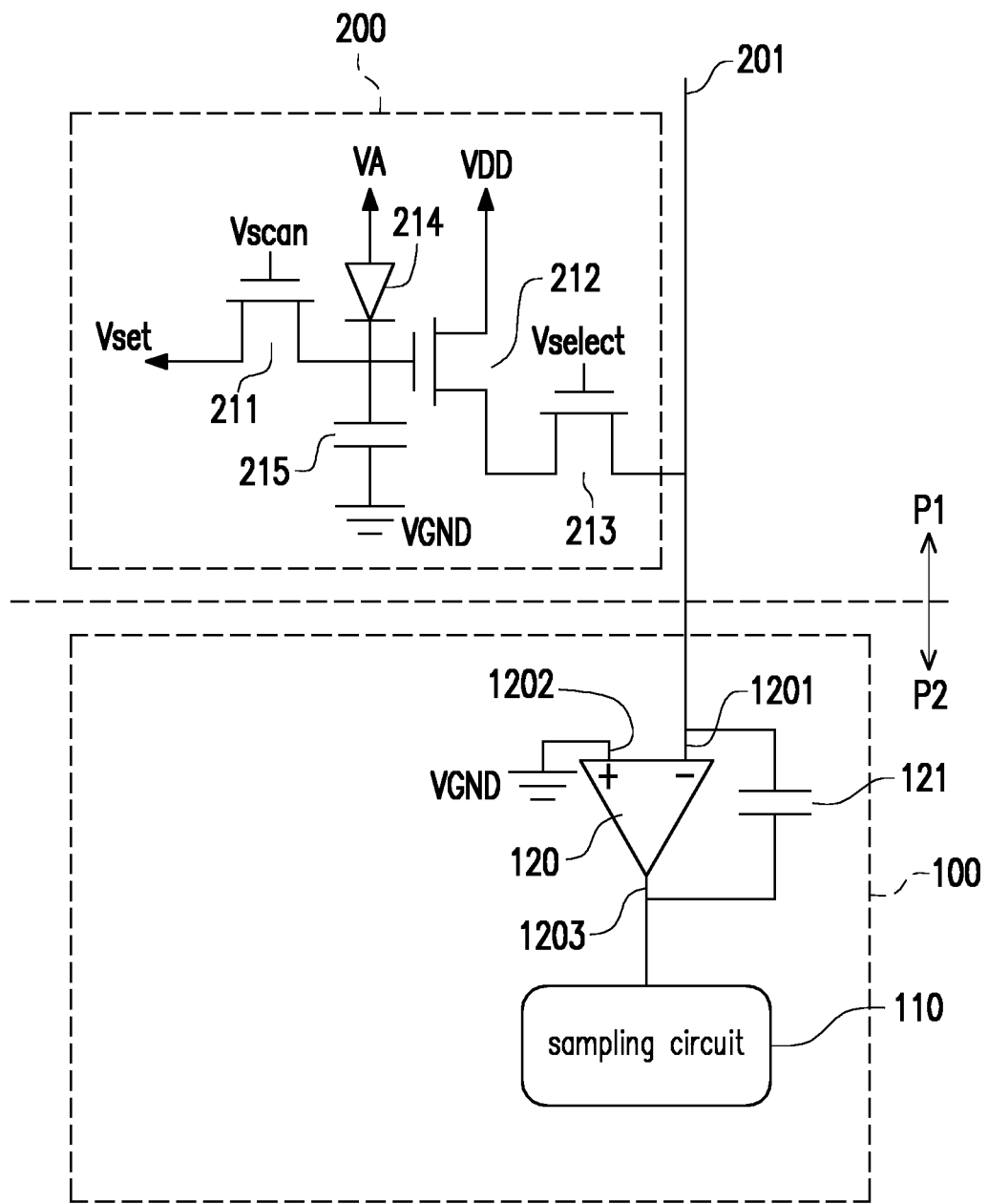
FIG. 1 is a schematic circuit diagram of a light sensor and a processing circuit according to an embodiment of the disclosure.

Reference will now be made in detail to the exemplary embodiments of the disclosure, and examples of the exemplary embodiments are illustrated in the accompanying drawings. Whenever possible, the same element symbols are used in the drawings and descriptions to indicate the same or similar elements. It should be noted that, in order to facilitate the understanding and simplicity of the drawings, the multiple drawings in the disclosure only provides drawings of part of the electronic device or display device, and the specific elements in the drawings are not drawn according to actual scale. In addition, the number and size of each element are used to illustrate but not to limit the scope of the disclosure. For example, for the sake of clarity, the relative size, thickness, and position of each layer, region, or structure may be reduced or enlarged.

Throughout the disclosure and the appended claims, certain words are used to refer to specific elements. Those skilled in the art should understand that electronic device manufacturers may refer to the same elements by different names. The specification does not intend to distinguish between elements that have the same function but different names. In the following description and claims, the words "have" and "include" are open-ended words, so they should be interpreted as "including but not limited to . . . ".

Directional wordings mentioned in the following embodiments, such as "up," "down," "left," "right," "front," and "back," merely refer to directions in the accompanying drawings. Therefore, the directional wordings are used to illustrate rather than limit the disclosure. It should be understood that when a component or film layer is referred to as being "on" or "connected" to another component or film layer, the component or film layer may be directly on the other component or film layer or directly connected to the other component or film layer, or there is an interposed component or film layer between the two (indirect case). Conversely, when a component or film layer is said to be "directly" on or "directly connected" to another component or film layer, there is no intervening component or film layer between the two.

The terms "approximately", "equal to", "equal", "same", "substantially" or "substantially" referred to herein generally represent falling within 10% of a given value or range, or representing falling within 5%, 3%, 2%, 1% or 0.5% of a given value or range. In addition, the terms "the given range is the first numerical value to the second numerical value", "the given range falls within the range of the first numerical value to the second numerical value" mean that the given range includes the first numerical value, the second numerical value, and their other values in between.

In some embodiments of the disclosure, terms such as "connected", "interconnected", etc. regarding bonding and connection, unless specifically defined, can mean that two structures are in direct contact, or that two structures are not in direct contact, and there are other structures located between these two structures. The terms of joining and connecting can also include the case where both structures are movable or both structures are fixed. In addition, the terms "electrical connection" and "coupling" include any direct and indirect electrical connection means.

In the following embodiments, the same or similar components will use the same or similar reference numerals, and the redundant description will be omitted. In addition, the features in different embodiments can be mixed and matched arbitrarily as long as they do not violate the spirit of the disclosure or conflict, and simple equivalent changes and modifications made in accordance with this specification or claims still fall within the scope of this disclosure. In addition, the terms "first", "second", and so on used in this specification or claims are used to name the elements or distinguish different embodiments or ranges from each other, and should not be construed as the upper limit or lower limit of the number of the elements or as a limitation to the order of the elements or the order of the device.

It should be noted that the following embodiments can replace, recombine, and mix the technical features of several different embodiments without departing from the spirit of the disclosure to complete other embodiments. The features among the embodiments can be mixed and matched arbitrarily as long as they do not violate the spirit of the disclosure or conflict.

FIG. 1 is a schematic circuit diagram of a light sensor 200 and a processing circuit 100 according to an embodiment of the disclosure. Referring to FIG. 1, the processing circuit 100 may be disposed, for example, in a surrounding area P2 of a panel, and the light sensor 200 may be disposed, for example, in an active area P1 of the panel. The active area P1 of the panel may include, for example, a pixel array (not shown), and each pixel of the pixel array may include, for example, the light sensor 200. In the embodiment, the light sensor 200 may be an active pixel sensor (APS), but the disclosure is not limited thereto. In an embodiment, the light sensor 200 may also be a passive pixel sensor (PPS). In the embodiment, the light sensor 200 may be configured to sense X-rays, but the disclosure is not limited thereto. In an embodiment, the light sensor 200 may also be a light sensor for sensing light signals of other wavebands. The light sensor 200 is coupled to the processing circuit 100 through a signal line 201. In the embodiment, the processing circuit 100 includes a sampling circuit 110 and an amplifier 120. The amplifier 120 includes an inverting input terminal 1201, a non-inverting input terminal 1202, and an output terminal 1203. The inverting input terminal 1201 of the amplifier 120 is coupled to the light sensor 200 through the signal line 201, and the inverting input terminal 1201 of the amplifier 120 is coupled to the output terminal 1203 of the amplifier 120 through a capacitor 121. The non-inverting input terminal 1202 of the amplifier 120 is coupled to a ground voltage VGND. The output terminal 1203 of the amplifier 120 is coupled to the sampling circuit 110.

In the embodiment, the light sensor 200 includes at least one transistor switch, such as transistor switches 211 to 213, a photodiode 214, and a storage capacitor 215. The transistor switches 211 to 213 may be a thin-film transistor (TFT) with semiconductor materials respectively. The semiconductor materials include, for example, amorphous silicon, low temperature poly-silicon (LTPS), or a combination thereof. The transistor switches 211 to 213 may also be metal-oxide top-gate type, bottom-gate type, or double-gate type thin film transistors. The disclosure is not limited thereto. In some embodiments, different thin film transistors may have the different aforementioned semiconductor materials. A first terminal of the transistor switch 211 is coupled to a set voltage Vset, and a control terminal of the transistor switch 211 is coupled to a scanning voltage Vscan. A first terminal of the photodiode 214 is coupled to a reference voltage VA, and a second terminal of the photodiode 214 is coupled to a second terminal of the transistor switch 211, a first terminal of the storage capacitor 215, and a control terminal of the transistor switch 212. The photodiode 214 may be configured to sense light signals. A second terminal of the storage capacitor 215 is coupled to the ground voltage VGND. A first terminal of the transistor switch 212 is coupled to a power supply voltage VDD, and a second terminal of the transistor switch 212 is coupled to a first terminal of the transistor switch 213. A control terminal of the transistor switch 213 is coupled to a selection voltage Vselect, and a second terminal of the transistor switch 213 is coupled to the signal line 201. In the embodiment, the sampling circuit 110 may perform correlated triple sampling (CTS) to obtain a first voltage, a second voltage, and a sampling voltage of the light sensor 200 in different periods through the amplifier 120, and the first voltage, the second voltage, and the sampling voltage are calculated to obtain a sensing voltage of the light sensor 200.

Figure 2:
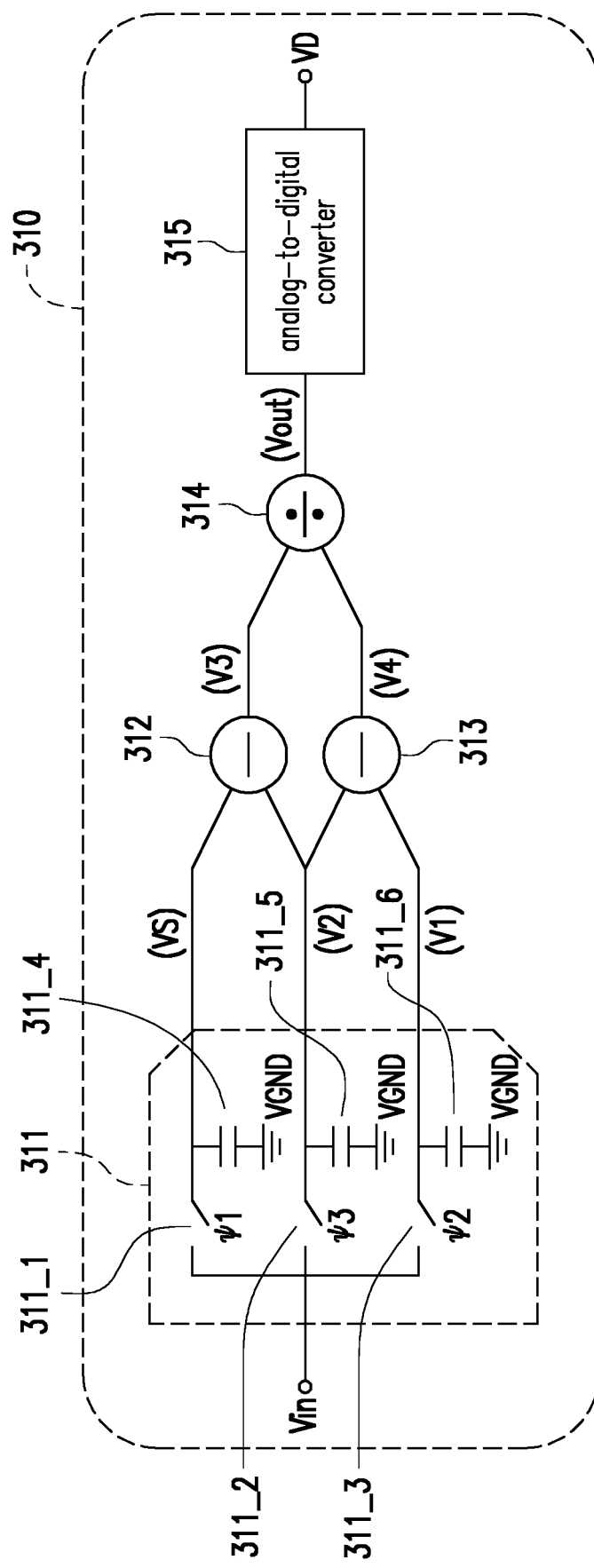
FIG. 2 is a schematic structural diagram of a sampling circuit according to an embodiment of the disclosure.

FIG. 2 is a schematic structural diagram of a sampling circuit 310 according to an embodiment of the disclosure. In an embodiment of the disclosure, the sampling circuit 110 in FIG. 1 may, for example, implement the schematic structural diagram of the sampling circuit 310 in FIG. 2. Referring to FIG. 2, the sampling circuit 310 includes a switch circuit 311, subtraction calculation units 312 and 313, a division calculation unit 314, and an analog-to-digital converter (ADC) 315. In the embodiment, the switch circuit 311 includes switches 311_1 to 311_3 and capacitors 311_4 to 311_6. The switch circuit 311 is coupled to an input voltage Vin. The input voltage Vin is from the output terminal 1203 of the amplifier 120 in FIG. 1. In the embodiment, a first terminal of the switch 311_1 receives the input voltage Vin, and a second terminal of the switch 311_1 is coupled to a first terminal of the capacitor 311_4 and the subtraction calculation unit 312. A second terminal of the capacitor 311_4 is coupled to the ground voltage VGND. A first terminal of the switch 311_2 receives the input voltage Vin, and a second terminal of the switch 311_2 is coupled to a first terminal of the capacitor 311_5 and the subtraction calculation units 312 and 313. A second terminal of the capacitor 311_5 is coupled to the ground voltage VGND. A first terminal of the switch 311_3 receives the input voltage Vin, and a second terminal of the switch 311_3 is coupled to a first terminal of the capacitor 311_6 and the subtraction calculation unit 313. A second terminal of the capacitor 311_6 is coupled to the ground voltage VGND. The subtraction calculation units 312 and 313 are also coupled to the division calculation unit 314, and the division calculation unit 314 is also coupled to the analog-to-digital converter 315.

In the embodiment, the sampling circuit 310 samples the light sensor 200 through the amplifier 120 in FIG. 1, such as a sampling voltage VS generated after sensing an X-ray signal. In detail, the switches 311_1 to 311_3 of the switch circuit 311 receive switching signals ψ1 to ψ3, respectively, to receive the sampling voltage VS, a first voltage V1, and a second voltage V2 in different sampling periods, and store them in the capacitors 311_4 to 311_6. The capacitor 311_4 stores the sampling voltage VS and provides it to the subtraction calculation unit 312. The capacitor 311_5 stores the second voltage V2 and provides it to the subtraction calculation units 312 and 313. The capacitor 311_6 stores the first voltage V1 and provides it to the subtraction calculation unit 313. The subtraction calculation unit 312 performs a calculation as in the following equation (1), where the subtraction calculation unit 312 subtracts the second voltage V2 from the sampling voltage VS to obtain a third voltage V3. The subtraction calculation unit 313 performs a calculation as in the following equation (2), where the subtraction calculation unit 313 subtracts the second voltage V2 from the first voltage V1 to obtain a fourth voltage V4. Then, the subtraction calculation units 312 and 313 respectively provide the third voltage V3 and the fourth voltage V4 to the division calculation unit 314, and the division calculation unit 314 performs a calculation as in the following equation (3), where the division calculation unit 314 divides the third voltage by the fourth voltage to obtain a sensing voltage Vout. In the embodiment, the analog-to-digital converter 315 converts the sensing voltage Vout into a digital signal VD.

$$V3 = VS - V2 \quad \text{Equation (1)}$$

$$V4 = V1 - V2 \quad \text{Equation (2)}$$

$$Vout = \frac{V3}{V4} = \frac{VS - V2}{V1 - V2} \quad \text{Equation (3)}$$

Figure 3:
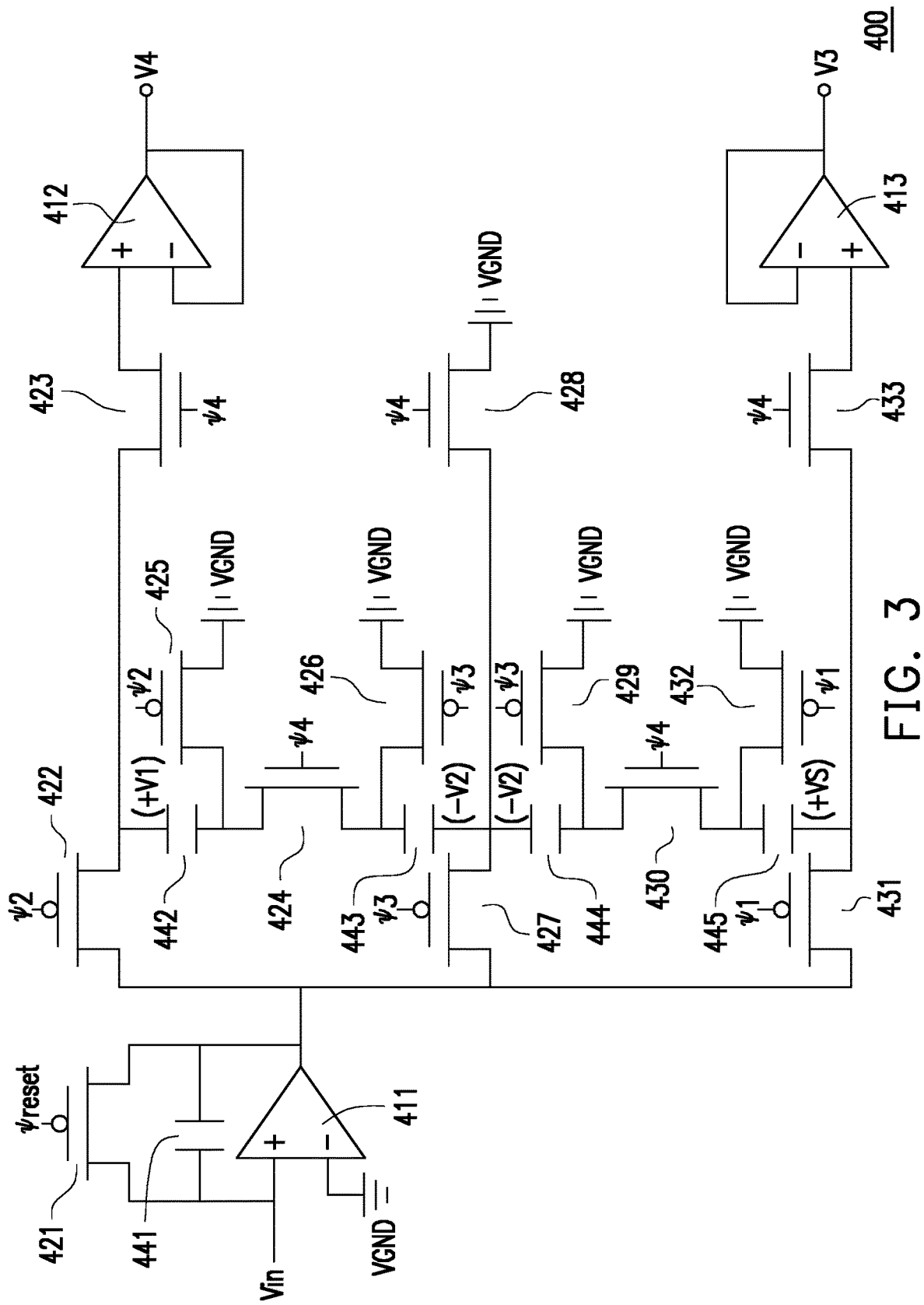
FIG. 3 is a schematic circuit diagram of a subtractor circuit according to an embodiment of the disclosure.

FIG. 3 is a schematic circuit diagram of a subtractor circuit 400 according to an embodiment of the disclosure. In an embodiment of the disclosure, the switch circuit 311, the subtraction calculation unit 312, and the subtraction calculation unit 313 in FIG. 2 may, for example, implement the schematic circuit diagram of the subtractor circuit 400 in FIG. 3. Referring to FIG. 3, the subtractor circuit 400 includes amplifiers 411, 412, and 413; transistor switches 421 to 433; and capacitors 441 to 445. In detail, the non-inverting input terminal of the amplifier 411 receives the input voltage Vin, and the inverting input terminal of the amplifier 411 is coupled to the ground voltage VGND. The non-inverting input terminal of the amplifier 411 is also coupled to a first terminal of the capacitor 441 and a first terminal of the transistor switch 421. A second terminal of the capacitor 441 and a second terminal of the transistor switch 421 are coupled to an output terminal of the amplifier 411. A control terminal of the transistor switch 421 receives a reset signal ψreset. In the embodiment, a first terminal of the transistor switch 422 is coupled to the output terminal of the amplifier 411, and a control terminal of the transistor switch 422 receives a switching signal ψ 2. A second terminal of the transistor switch 422 is coupled to a first terminal (positive electrode) of the capacitor 442 and a first terminal of the transistor switch 423. A control terminal of the transistor switch 423 receives a switching signal ψ 4, and a second terminal of the transistor switch 423 is coupled to the non-inverting input terminal of the amplifier 412. The inverting input terminal and the output terminal of the amplifier 412 are coupled to form a voltage follower. A second terminal (negative electrode) of the capacitor 442 is coupled to a first terminal of the transistor switch 425 and a first terminal of the transistor switch 424. A control terminal of the transistor switch 425 receives the switching signal ψ 2, and a second terminal of the transistor switch 425 is coupled to the ground voltage VGND.

In the embodiment, a first terminal of the transistor switch 427 is coupled to the output terminal of the amplifier 411, and a control terminal of the transistor switch 427 receives a switching signal ψ 3. A second terminal of the transistor switch 427 is coupled to a first terminal (negative electrode) of the capacitor 443, a first terminal (negative electrode) of the capacitor 444, and a first terminal of the transistor switch 428. A control terminal of the transistor switch 428 receives the switching signal ψ 4, and a second terminal of the transistor switch 428 is coupled to the ground voltage VGND. A second terminal (positive electrode) of the capacitor 443 is coupled to a second terminal of the transistor switch 424 and a first terminal of the transistor switch 426. A control terminal of the transistor switch 424 receives the switching signal ψ 4. A control terminal of the transistor switch 426 receives the switching signal ψ 3, and a second terminal of the transistor switch 426 is coupled to the ground voltage VGND. A second terminal (positive electrode) of the capacitor 444 is coupled to a first terminal of the transistor switch 430 and a first terminal of the transistor switch 429. A control terminal of the transistor switch 430 receives the switching signal ψ 4. A control terminal of the transistor switch 429 receives the switching signal ψ 3, and a second terminal of the transistor switch 429 is coupled to the ground voltage VGND.

In the embodiment, a first terminal of the transistor switch 431 is coupled to the output terminal of the amplifier 411, and a control terminal of the transistor switch 431 receives the switching signal ψ 1. A second terminal of the transistor switch 431 is coupled to a first terminal (positive electrode) of the capacitor 445 and a first terminal of the transistor switch 433. A control terminal of the transistor switch 433 receives the switching signal ψ 4, and a second terminal of the transistor switch 433 is coupled to the non-inverting input terminal of the amplifier 413. The inverting input terminal and the output terminal of the amplifier 413 are coupled to form the voltage follower. A second terminal (negative electrode) of the capacitor 445 is coupled to a second terminal of the transistor switch 430 and a first terminal of the transistor switch 432. A control terminal of the transistor switch 432 receives the switching signal ψ 1, and a second terminal of the transistor switch 432 is coupled to the ground voltage VGND. In the embodiment, the switch 311_1 in FIG. 2 may, for example, correspond to the transistor switch 431 in FIG. 3, and the capacitor 311_4 in FIG. 2 may, for example, correspond to the capacitor 445 in FIG. 3. The switch 311_2 in FIG. 2 may, for example, correspond to the transistor switch 427 in FIG. 3, and the capacitor 311_5 in FIG. 2 may, for example, correspond to the capacitors 444 and 443 in FIG. 3. The switch 311_3 in FIG. 2 may, for example, correspond to the transistor switch 422 in FIG. 3, and the capacitor 311_6 in FIG. 2 may, for example, correspond to the capacitor 442 in FIG. 3.

In the embodiment, the transistor switches 421, 422, 425, 426, 427, 429, 431, and 432 may be P-type metal-oxide-semiconductor field-effect transistors (MOSFETs); and the transistor switches 423, 424, 428, 430, and 433 may be N-type metal-oxide-semiconductor field-effect transistors, but the disclosure is not limited thereto. In the embodiment, after the transistor switches 421 to 433 are switched by the reset signal ψreset and the switching signals ψ 1 to ψ3, the capacitor 442 stores the first voltage V1 (+V1). The capacitor 443 and the capacitor 444 store the second voltage V2 (−V2). The capacitor 445 stores the sampling voltage VS (+VS). In addition, after the transistor switches 421 to 433 are switched by the switching signal ψ 4, the output terminal of the amplifier 412 outputs the fourth voltage V4 (the first voltage V1 minus the second voltage V2 equals the fourth voltage V4), and the output terminal of the amplifier 413 outputs the third voltage V3 (the sampling voltage VS minus the second voltage V2 equals the third voltage V3).

Figure 4:
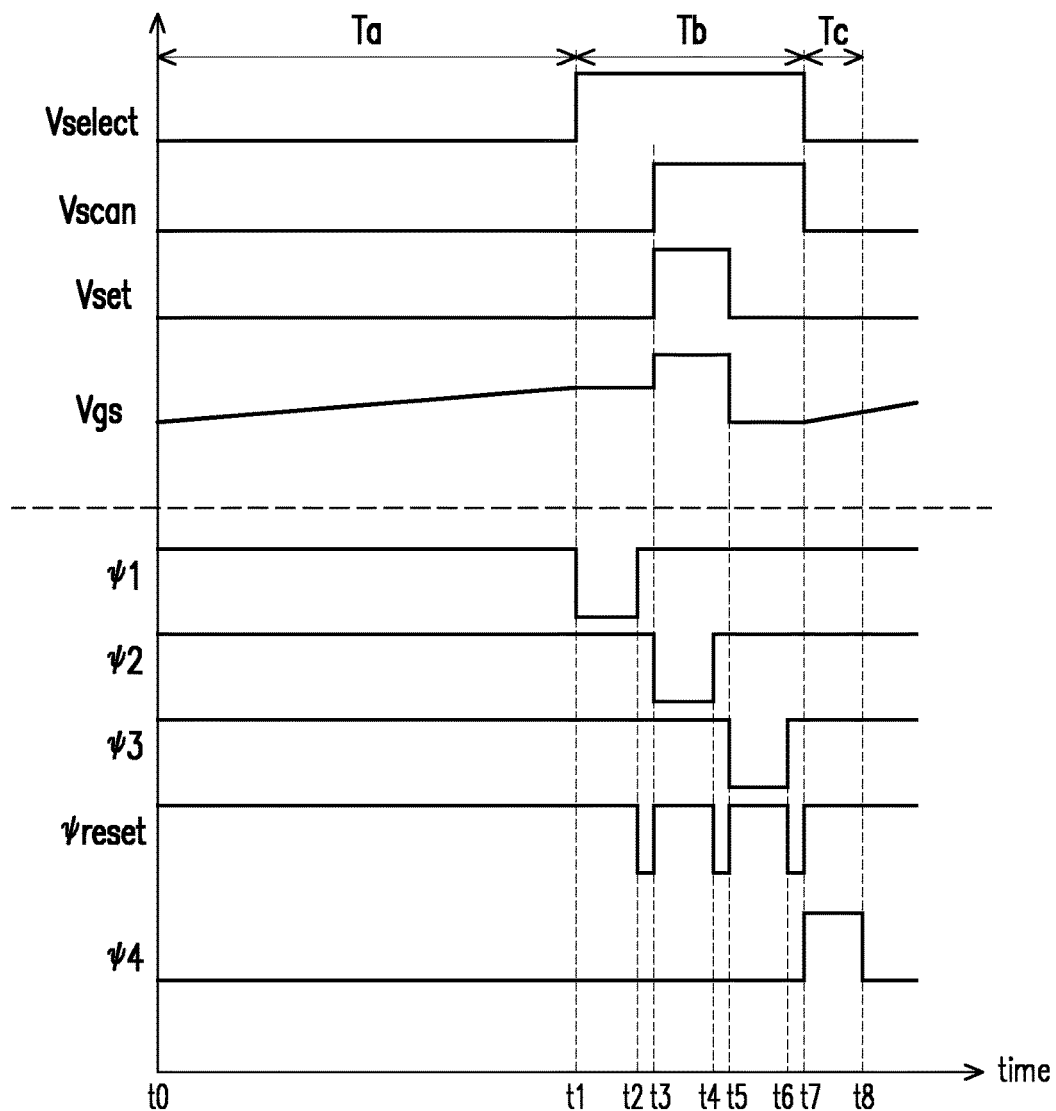
FIG. 4 is a signal timing diagram of a processing circuit according to an embodiment of the disclosure.

FIG. 4 is a signal timing diagram of the processing circuit 100 according to an embodiment of the disclosure. The signal timing in FIG. 4 is an implementation manner that corresponds to the changes of the switching signals and voltage signals in FIG. 1 to FIG. 3 in an embodiment of the disclosure. Referring to FIG. 1 and FIG. 4, in the integration period Ta (from time t0 to time t1), the transistor switches 211 to 213 of the light sensor 200 are not turned on, and a voltage Vgs of the control terminal of the transistor switch 212 increases since the photodiode 214 is performing the light sensing. In the sampling period Tb (from time t1 to time t7), the selection voltage Vselect is switched to a high potential between time t1 and time t7 so that the transistor switch 213 is turned on between time t1 and time t7. The scanning voltage Vscan is switched to a high potential between time t3 and time t7 so that the transistor switch 211 is turned on between time t3 and time t7. The set voltage Vset is switched from a low potential (the second voltage V2) to a high potential (the first voltage V1) at time t3 and maintain the high potential between time t3 and time t5 so that the control terminal of the transistor switch 212 receives the high potential (the first voltage V1) between time t3 and time t5.

Referring to FIG. 3 and FIG. 4, in the sampling period Tb (from time t1 to time t7), the switching signal ψ 1 is switched from a high potential to a low potential between time t1 and time t2 (i.e., the first sampling period), and the reset signal ψreset maintains a high potential between time t1 and time t2 so that the transistor switches 431 and 432 are turned on, and the capacitor 445 stores the sampling voltage VS (+VS). The reset signal ψreset is switched from a high potential to a low potential between time t2 and time t3 to reset the capacitor 441 for the next sampling. Then, the switching signal ψ 2 is switched from a high potential to a low potential between time t3 and time t4 (i.e., the second sampling period), and the reset signal ψreset maintains a high potential between time t3 and time t4 so that the transistor switches 422 and 425 are turned on, and the capacitor 442 stores the first voltage V1 (+V1). The reset signal ψreset is switched from a high potential to a low potential between time t4 and time t5 to reset the capacitor 441 for the next sampling. Then, the switching signal ψ 3 is switched from a high potential to a low potential between time t5 and time t6 (i.e., the third sampling period), and the reset signal ψreset maintains a high potential between time t5 and time t6 to turn on the transistor switches 426, 427, and 429, and the capacitors 443 and 444 respectively store the second voltage V2 (−V2). The reset signal ψreset is switched from a high potential to a low potential between time t6 and time t7 to reset the capacitor 441. Finally, in the readout period Tc, the switching signal ψ 4 is switched from a high potential to a low potential (or from a low potential to a high potential, depending on the type of the transistor switch used) between time t7 and time t8 so that the transistor switches 423, 424, 428, 430, and 433 are turned on. Therefore, the output terminal of the amplifier 412 outputs the fourth voltage V4 (the first voltage V1 minus the second voltage V2 equals the fourth voltage V4), and the output terminal of the amplifier 413 outputs the third voltage V3 (the sampling voltage VS minus the second voltage V2 equals the third voltage V3). In addition, the division calculation unit 314 shown in FIG. 2 performs a calculation as in the equation (3) to generate the sensing voltage Vout.

Figure 5:
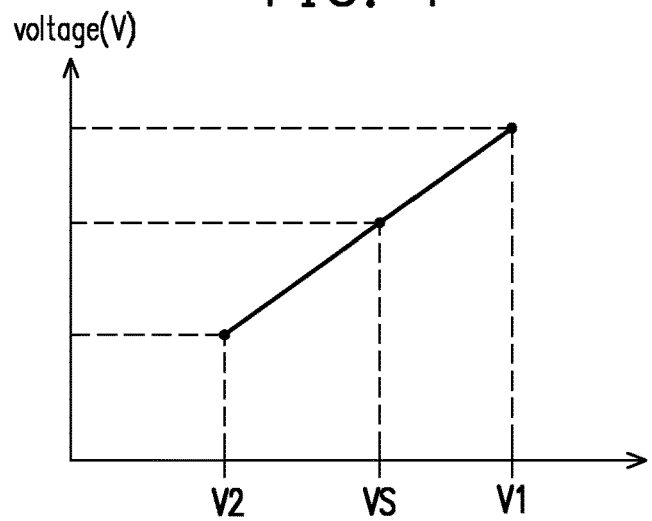
FIG. 5 is a voltage relationship diagram of a first voltage, a second voltage, and a sampling voltage according to an embodiment of the disclosure.

Referring to FIG. 1 and FIG. 4, according to the timing relationship of the switching signals ψ 1 to ψ3, the sampling circuit 110 obtains the sampling voltage VS, the first voltage V1, and the second voltage V2 in sequence in the first sampling period (from time t1 to time t2), the second sampling period (from time t3 to time t4), and the third sampling period (from time t5 to time t6), respectively. Noted that the first reset period (from time t2 to time t3) is included between the first sampling period and the second sampling period, and the sampling circuit 110 obtains the sampling voltage VS through the storage capacitor 215 of the light sensor 200 before the first reset period. The second reset period (from time t4 to time t5) is included between the second sampling period and the third sampling period, and the sampling circuit 110 obtains the first voltage V1 through the set voltage Vset at a high potential before the second reset period. The third reset period (from time t6 to time t7) is included between the third sampling period and the readout period Tc, and the sampling circuit 110 obtains the second voltage V2 through the set voltage Vset at a low potential before the third reset period. In this regard, the voltage magnitude relationship of the sampling voltage VS, the first voltage V1, and the second voltage V2 of the embodiment is shown in FIG. 5. FIG. 5 is a voltage relationship diagram of the first voltage V1, the second voltage V2, and the sampling voltage VS according to an embodiment of the disclosure. As shown in FIG. 5, the sampling voltage VS is between the first voltage V1 and the second voltage V2.

Moreover, in a measurement embodiment, the measurer, for example, may measure an electrical signal between at least one light sensor and the readout circuit in the measured object (e.g., a sensing array). The measurer determines whether the measured object implements the architecture and the timing design of the light sensor and the processing circuit same as the disclosed in the disclosure according to whether the magnitude of the measured voltage and the signal timing relationship are same as the results of switching signals and voltage signals shown in FIG. 4.

In other words, referring to FIG. 2 and FIG. 4, the sampling circuit 310 obtains the sampling voltage VS, the first voltage V1, and the second voltage V2 by means of correlated triple sampling in the sampling period Tb, and the subtraction calculation units 312 and 313 are configured to perform the calculations of the equations (1) and (2) to obtain the third voltage V3 and the fourth voltage V4. In addition, the division calculation unit 314 performs the calculation of the equation (3) to obtain the sensing voltage Vout and provides the sensing voltage Vout to the analog-to-digital converter 315. The analog-to-digital converter 315 converts the sensing voltage Vout into the digital signal VD. Note that according to the relationship between the read-out timing and the magnitude of the voltage of the sampling voltage VS, the first voltage V1, and the second voltage V2 in FIGS. 1 to 5, the processing circuit 100 can effectively compensate for the influence, such as the threshold voltage (VTH) and mobility, which the process variation of each transistor in the light sensor 200 have on the sensing signal or the effect of reducing or eliminating background noise can be achieved, so as to improve the read-out quality of the sensing signal of the light sensor 200 with high dynamic range or high resolution.

Figure 6:
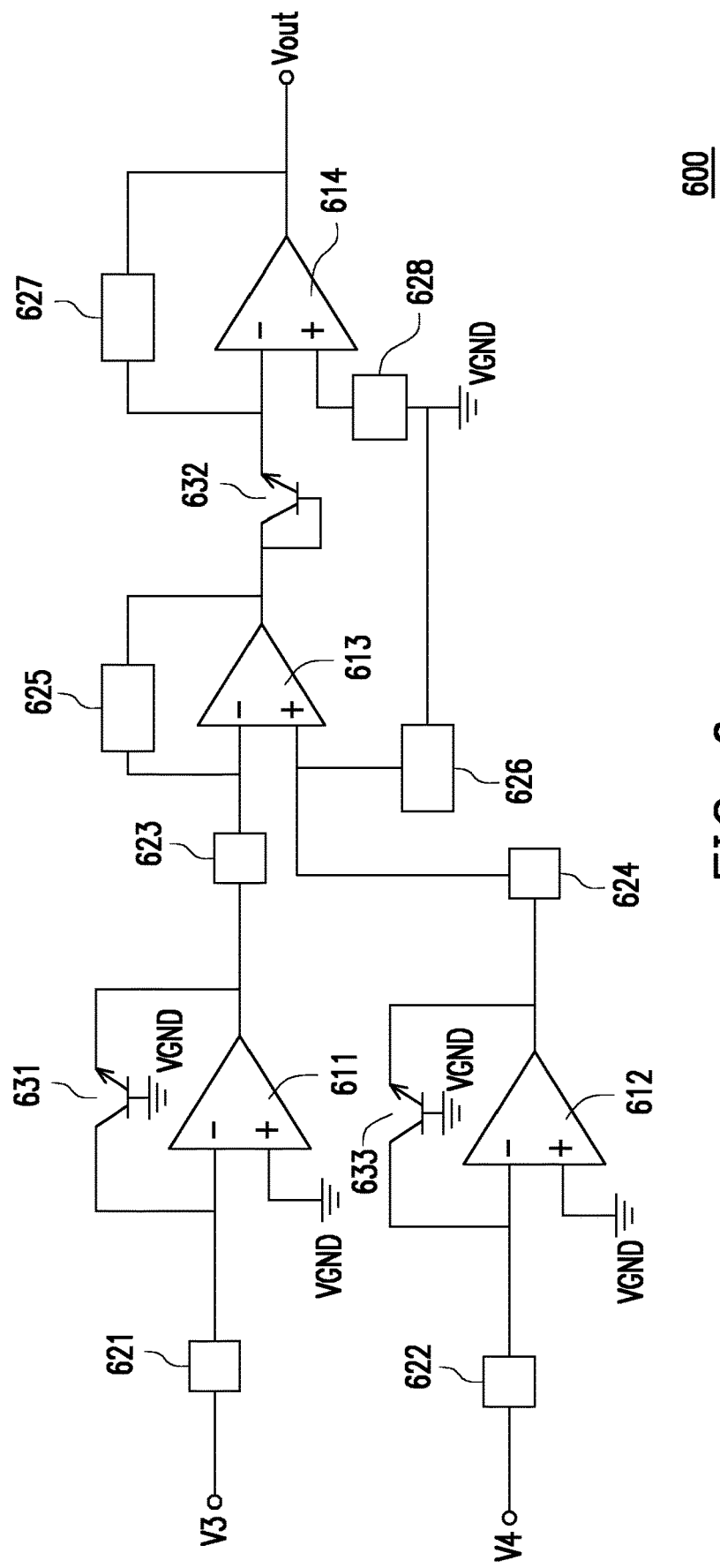
FIG. 6 is a schematic circuit diagram of a divider circuit according to an embodiment of the disclosure.

FIG. 6 is a schematic circuit diagram of a divider circuit 600 according to an embodiment of the disclosure. In an embodiment of the disclosure, the division calculation unit 314 in FIG. 2 may, for example, implement the schematic circuit diagram of the divider circuit 600 in FIG. 6. Referring to FIG. 6, the divider circuit 600 includes amplifiers 611 to 614, resistor units 621 to 628, and transistor switches 631 to 633. In one embodiment, the transistor switches 631 to 633 respectively are a bipolar junction transistor (BJT). For example, the transistor switches 631 to 633 respectively are an N-type bipolar transistor or a P-type bipolar transistor, and the disclosure is not limited thereto. The resistor unit 621 to 628 respectively include one or more resistors. In another embodiment, the resistor units 621 to 628 may be one or more equivalent resistors. Note that not all the resistor units 621 to 628 are equivalent resistors or resistors, and some of them may be equivalent resistors and some of them are resistors. For example, the resistor units 621 to 624 may be equivalent resistors, and the resistor units 625 to 628 may be resistors. In the embodiment, a first terminal of the resistor unit 621 receives the third voltage V3 (the sampling voltage VS minus the second voltage V2 equals the third voltage) output by the subtractor circuit 400 as shown in FIG. 3, and a second terminal of the resistor unit 621 is coupled to an inverting input terminal of the amplifier 611. The inverting input terminal of the amplifier 611 is coupled to a collector (C) of the transistor switch 631, and an emitter (E) of the transistor switch 631 is coupled to an output terminal of the amplifier 611. A base (B) of the transistor switch 631 is coupled to the ground voltage VGND. A non-inverting input terminal of the amplifier 611 is coupled to the ground voltage VGND. The output terminal of the amplifier 611 is coupled to a first terminal of the resistor unit 623. In the embodiment, a first terminal of the resistor unit 622 receives the fourth voltage V4 (the first voltage V1 minus the second voltage V2 equals the fourth voltage V4) output by the subtractor circuit 400 as shown in FIG. 3, and a second terminal of the resistor unit 622 is coupled to an inverting input terminal of the amplifier 612. The inverting input terminal of the amplifier 612 is coupled to a collector of the transistor switch 633, and an emitter of the transistor switch 633 is coupled to an output terminal of the amplifier 612. A base of the transistor switch 633 is coupled to the ground voltage VGND. The non-inverting input terminal of the amplifier 612 is coupled to the ground voltage VGND. The output terminal of the amplifier 612 is coupled to a first terminal of the resistor unit 624.

In the embodiment, a second terminal of the resistor unit 623 is coupled to an inverting input terminal of the amplifier 613 and a first terminal of the resistor unit 625. A second terminal of the resistor unit 625 is coupled to an output terminal of the amplifier 613. A second terminal of the resistor unit 624 is coupled to the non-inverting input terminal of the amplifier 613 and a first terminal of the resistor unit 626. A second terminal of the resistor unit 626 is coupled to the ground voltage VGND and a first terminal of the resistor unit 628. The output terminal of the amplifier 613 is coupled to a collector of the transistor switch 632, and the collector of the transistor switch 632 is coupled to a base of the transistor switch 632. An emitter of the transistor switch 632 is coupled to an inverting input terminal of the amplifier 614. In the embodiment, the inverting input terminal of the amplifier 614 is also coupled to a first terminal of the resistor unit 627, and a second terminal of the resistor unit 627 is coupled to an output terminal of the amplifier 614. The non-inverting input terminal of the amplifier 614 is coupled to a second terminal of the resistor unit 628. The output terminal of the amplifier 614 outputs the sensing voltage Vout.

In the embodiment, the amplifier 611 performs the calculation of taking the logarithm of the third voltage V3, and the amplifier 612 performs the calculation of taking the logarithm of the fourth voltage V4. The amplifier 613 performs the following equation (4) to subtract the logarithmic fourth voltage V4 from the logarithmic third voltage V3, and the amplifier 614 performs the following equation (5) to take the logarithm of the output result of the amplifier 613 to obtain the output sensing voltage Vout. Note that the values of coefficients $\alpha_1$, $\alpha_2$, and $\alpha_3$ are determined by the resistance values of the resistor units 621 to 628. In one embodiment, if the resistance values of the resistor units 621 to 624, 627, and 628 are the same, the values of the coefficient $\alpha_3$ is 1.

$$\log(\alpha_1 \cdot V3) - \log(\alpha_2 \cdot V4) = \log\left(\alpha_3 \cdot \frac{V3}{V4}\right) = \log\left(\alpha_3 \cdot \frac{VS - V2}{V1 - V2}\right) \quad \text{Equation (4)}$$

$$Vout = \log^{-1}\left[\log\left(\alpha_3 \cdot \frac{VS - V2}{V1 - V2}\right)\right] = \alpha_3 \cdot \frac{VS - V2}{V1 - V2} \quad \text{Equation (5)}$$

Figure 7:
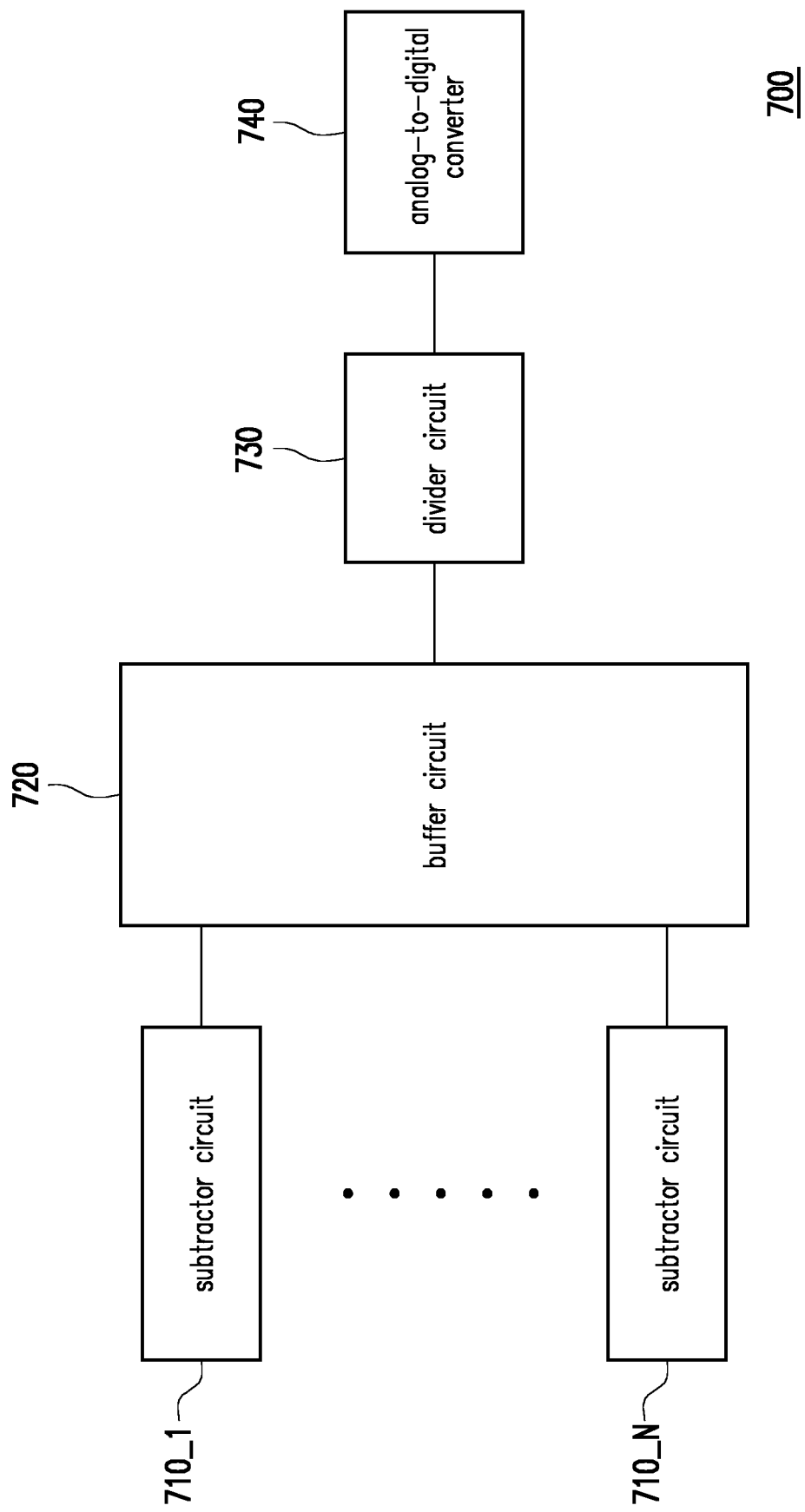
FIG. 7 is a schematic structural diagram of a sampling circuit according to another embodiment of the disclosure.

FIG. 7 is a schematic structural diagram of a sampling circuit 700 according to another embodiment of the disclosure. Referring to FIG. 7, the sampling circuit 700 in the embodiment includes a plurality of subtractor circuits 710_1 to 710_N, a buffer circuit 720, a divider circuit 730, and an analog-to-digital converter 740, where the N is a positive integer. The plurality of subtractor circuits 710_1 to 710_N are coupled to the buffer circuit 720. The buffer circuit 720 is coupled to the divider circuit 730. The divider circuit 730 is coupled to the analog-to-digital converter 740. Referring to FIG. 1, since the sampling circuit 110 in FIG. 1 receives one or a row of the light sensors 200 through the signal line 201, the sampling circuit 110 in FIG. 1 may include the subtractor circuit 400 in FIG. 3 and the divider circuit 600 in FIG. 6. However, compared to FIG. 1, the subtractor circuits 710_1 to 710_N of the sampling circuit 700 in the embodiment are coupled to multiple or multiple rows of light sensors through multiple signal lines so that the subtractor circuits 710_1 to 710_N obtain the first voltage, the second voltage, and the sampling voltage of their corresponding light sensor. In addition, the first voltage, the second voltage, and the sampling voltage respectively provided by the subtractor circuits 710_1 to 710_N are temporarily stored through the buffer circuit 720 and are output to the divider circuit 730 for calculation in a time-sharing manner. The divider circuit 730 outputs multiple sensing voltages of multiple light sensors to the analog-to-digital converter 740 in a time-sharing manner. In other words, since the sampling circuit 700 is disposed in the surrounding area P2 of the panel as shown in FIG. 1, the design of the sampling circuit 700 in the embodiment effectively reduces the area of the processing circuit in the surrounding area P2 so that cost saving is achieved, a narrow frame is achieved, or the surrounding area P2 of the panel as shown in FIG. 1 can obtain additional space to configure other functional circuits.

Figure 8:
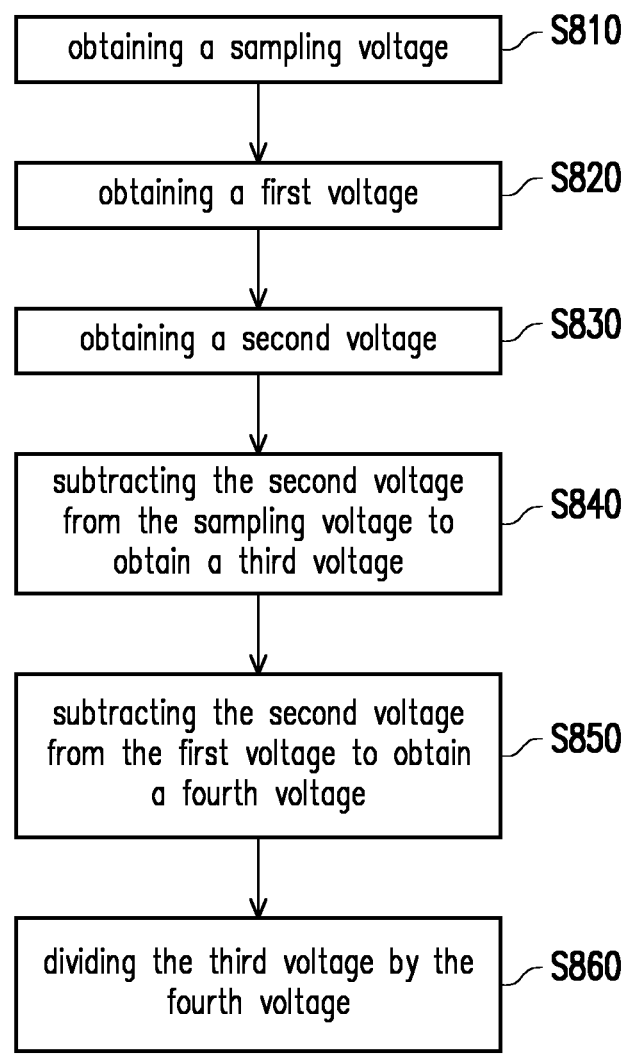
FIG. 8 is a flowchart of a signal processing method of a sampling circuit according to an embodiment of the disclosure.

FIG. 8 is a flowchart of a signal processing method of a sampling circuit according to an embodiment of the disclosure. Referring to FIG. 2 and FIG. 8, the signal processing method of the embodiment may be adapted to the sampling circuit 310 in the embodiment of FIG. 2. The sampling circuit 310 samples the light sensor 200 through the amplifier 120 in FIG. 1. In step S810, the sampling circuit 310 obtains the sampling voltage VS, and the switch circuit 311 stores the sampling voltage VS in the capacitor 311_4 according to the switching results of the switching signals ψ1 to ψ3. In step S820, the sampling circuit 310 obtains the first voltage V1, and the switch circuit 311 stores the first voltage V1 in the capacitor 311_6 according to the switching results of the switching signals ψ1 to ψ3. In step S830, the sampling circuit 310 obtains the second voltage V2, and the switch circuit 311 stores the second voltage V2 in the capacitor 311_5 according to the switching results of the switching signals ψ1 to ψ3. The sampling voltage VS is between the first voltage V1 and the second voltage V2. In step S840, the subtraction calculation unit 312 of the sampling circuit 310 subtracts the second voltage V2 from the sampling voltage VS to obtain the third voltage V3. In step S850, the subtraction calculation unit 313 of the sampling circuit 310 subtracts the second voltage V2 from the first voltage V1 to obtain the fourth voltage V4. In step S860, the division calculation unit 314 of the sampling circuit 310 divides the third voltage V3 by the fourth voltage V4 to obtain the sensing voltage Vout. Therefore, with the signal processing method in the embodiment, the sampling circuit 310 obtains the sensing voltage Vout in an effective manner.

In addition, with regard to the relevant implementation content and circuit features of the sampling circuit 310 in the embodiment, reference may be made to the description of the aforementioned embodiments in FIG. 1 to FIG. 7 to obtain sufficient teachings, suggestions, and implementation descriptions, so no further description will be given.

Based on the above, with the processing circuit of the disclosure, the sensing voltage of the light sensor is read out by means of correlated triple sampling, so as to effectively solve the problem of sensing signal drift caused by the process variation of the transistor in the light sensor or the effect of background noise. For example, the influence of critical voltage or drift rate can be eliminated. Therefore, with the processing circuit in the disclosure, the read-out quality of the sensing signal of the light sensor with high dynamic range or high resolution can be improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A processing circuit, adapted to read out a sensing voltage of an X-ray sensor, wherein comprises:
    an amplifier comprising an inverting input terminal, a non-inverting input terminal, and an output terminal, wherein the inverting input terminal of the amplifier is coupled to the X-ray sensor; and
    a sampling circuit coupled to the output terminal of the amplifier,
    wherein the sampling circuit obtains a first voltage, a second voltage, and a sampling voltage of the X-ray sensor in different periods, and the sampling voltage is between the first voltage and the second voltage, and
    wherein the sampling circuit subtracts the second voltage from the sampling voltage to obtain a third voltage in a readout period, subtracts the second voltage from the first voltage to obtain a fourth voltage, and divides the third voltage by the fourth voltage to read out the sensing voltage of the X-ray sensor.

2. The processing circuit according to claim 1, wherein the sampling circuit obtains the sampling voltage, the first voltage, and the second voltage in sequence in a first sampling period, a second sampling period, and a third sampling period, respectively.

3. The processing circuit according to claim 1, comprising a reset period between the first sampling period and the second sampling period, wherein the sampling circuit obtains the sampling voltage through the storage capacitor of the X-ray sensor before the reset period.

4. The processing circuit according to claim 1, wherein the sampling circuit comprises a subtractor circuit and a divider circuit.

5. The processing circuit according to claim 4, wherein the divider circuit comprises a plurality of bipolar junction transistors and a plurality of amplifiers.

6. The processing circuit according to claim 4, wherein the subtractor circuit is configured to subtract the second voltage from the sampling voltage to output the third voltage, and to subtract the second voltage from the first voltage to output the fourth voltage.

7. The processing circuit according to claim 4, wherein the sampling circuit further comprises a plurality of subtractor circuits and a buffer circuit, and the plurality of subtractor circuits are coupled to the divider circuit through the buffer circuit.

8. The processing circuit according to claim 1, wherein the sampling circuit further comprises:
    an analog-to-digital converter coupled to the sampling circuit and configured to convert the sensing voltage into a digital signal.

9. A signal processing method of a sampling circuit wherein the sampling circuit is coupled to an output terminal of an amplifier, and an X-ray sensor is coupled to an inverting input terminal of the amplifier, and the signal processing method comprises:
    obtaining a sampling voltage of the X-ray sensor by the sampling circuit;
    obtaining a first voltage of the X-ray sensor by the sampling circuit;
    obtaining a second voltage of the X-ray sensor by the sampling circuit;
    subtracting the second voltage from the sampling voltage to obtain a third voltage in a readout period by the sampling circuit;
    subtracting the second voltage from the first voltage to obtain a fourth voltage by the sampling circuit; and
    dividing the third voltage by the fourth voltage to read out a sensing voltage of the X-ray sensor by the sampling circuit.

10. The signal processing method according to claim 9, wherein the sampling voltage is between the first voltage and the second voltage.

* * * * *